US006529606B1

(12) United States Patent
Jackson, Jr. II et al.

(10) Patent No.: US 6,529,606 B1
(45) Date of Patent: *Mar. 4, 2003

(54) METHOD AND SYSTEM FOR REDUCING UNDESIRED SIGNALS IN A COMMUNICATION ENVIRONMENT

(75) Inventors: I. Riley Jackson, Jr. II, Schaumburg, IL (US); Thomas A. Freeburg, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 240 days.

This patent is subject to a terminal disclaimer.

(21) Appl. No.: 09/644,432

(22) Filed: Aug. 23, 2000

Related U.S. Application Data

(63) Continuation of application No. 08/857,399, filed on May 16, 1997.

(51) Int. Cl.[7] .................... H03B 29/00

(52) U.S. Cl. .................... 381/71.4; 381/94.7; 381/71.6

(58) Field of Search .................... 381/71.1, 71.6, 381/71.4, 71.13, 94.1, 94.7, 94.3; 379/406.01

(56) References Cited

U.S. PATENT DOCUMENTS

| | | | | | |
|---|---|---|---|---|---|
| H417 | H | * | 1/1988 | Miles | 381/71.6 |
| 5,182,774 | A | * | 1/1993 | Bourk | 381/71.6 |
| 6,130,949 | A | * | 10/2000 | Aoki et al. | 381/94.3 |
| 6,151,397 | A | * | 11/2000 | Jackson, Jr. II et al. | 381/71.4 |
| 6,256,394 | B1 | * | 7/2001 | Deville et al. | 381/94.7 |

* cited by examiner

*Primary Examiner*—Forester W. Isen
*Assistant Examiner*—Brian Pendleton
(74) *Attorney, Agent, or Firm*—Romi N. Bose; Hisashi D. Watanabe

(57) ABSTRACT

Methods and devices for reducing undesired signals in a communication environment. At least two distinct composite signals ($X_1$ and $X_2$) are transmitted from a first communication environment (260). A noise coefficient of the first communication environment (260) based on the at least two distinct composite signals ($X_1$ and $X_2$) is calculated. At least two noise canceling signals based on the noise coefficient are calculated. The at least two noise canceling signals are added to an incoming signal ($Y_3$) from a second communication environment (280) to produce at least two combined signals. The at least two combined signal are transmitted into the first communication environment (260).

12 Claims, 3 Drawing Sheets

METHOD AND SYSTEM FOR REDUCING UNDESIRED SIGNALS IN A COMMUNICATION ENVIRONMENT

This is a continuation of application Ser. No. 08/857,399 filed May 16, 1997.

FIELD OF THE INVENTION

The present invention relates to communication systems, for example, methods and systems for introducing an incoming signal along with canceling signals into an environment to cancel undesired signals (e.g., noise).

BACKGROUND OF THE INVENTION

In both mobile and land-line telephone systems, speaker-phone systems have been utilized to allow a user to communicate with another party without using a handset. Conventional speaker-phone systems usually include a microphone to transmit communications from the user and a speaker to transmit the incoming signals received from the other party communicating with the user.

In certain environments, the presence of background noise may distract and/or make it quite difficult for the user to hear the other party. For example, when using a speaker-phone system in a vehicle, the user is exposed to a variety of undesirable background noises introduced by the engine, exhaust system and tires as well as other noises. The presence of these background noises can interfere and reduce the ability of the user to hear the other party.

Accordingly, there is a need to eliminate or reduce undesirable signals within a particular environment. There is also a need to cancel undesired signals having a variety of frequency ranges and signals having a regular periodic or recurring component.

A preferred embodiment of the invention, is now described, by way of example only, with reference to the drawings.

BRIEF DESCRIPTION OF THE DRAWINGS

The features of the present invention are set forth with particularity in the appended claims. The invention itself, together with further features and attendant advantages, will become apparent from consideration of the following detailed description, taken in conjunction with the accompanying drawings. A preferred embodiment of the invention is now described, by way of example only, with reference to the accompanying drawings in which:

It will be appreciated that for simplicity and clarity of illustration, elements shown in the figures have not necessarily been drawn to scale. Where considered appropriate, reference numerals have been repeated among the figures to indicate corresponding elements.

DETAILED DESCRIPTION OF THE PREFERRED EMBODIMENT

Figure 1:
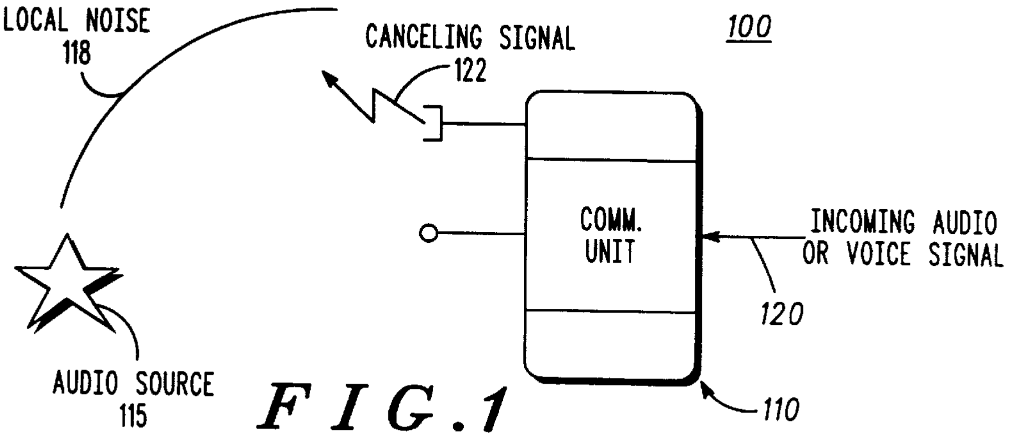
FIG. 1 is a diagrammatic view of a communication unit in accordance with a preferred embodiment of the invention.

For the purposes of promoting an understanding of the principles in accordance with the invention, reference will now be made to the embodiments illustrated in the drawings and specific language will be used to describe the same. It will nevertheless be understood that no limitation of the scope of the invention is thereby intended. Any alterations and further modifications of the illustrated embodiments, and any additional applications of the principles of the invention as illustrated herein, which are equivalent or would normally occur to one skilled in the relevant art, are to be considered within the scope of the invention claimed.

Referring now to the drawings, FIG. 1 illustrates a diagrammatic view of a communication environment 100 having a communication unit 110 (i.e., a speaker-phone), in accordance with a preferred embodiment of the invention. The communication unit 110 receives at least two distinct composite signals: signals from an audio or voice source 115 (i.e., the desired signal) that is corrupted by local noise 118 (i.e., the undesired signal). The communication unit 110 separates the local noise 118 from the audio source 115 to recover each signal separately.

To reduce the local noise 118 within the communication environment, a canceling signal 122 is generated and combined with an incoming signal 120 (e.g., audio or voice signal). The canceling signal 122 and the incoming signal 120 are introduced into the communication environment 100. The canceling signal 122 mixes with the local noise 118, so that the sum of the two waveforms approaches zero at the communication environment.

The canceling signal 122 produced by the communication unit 110 eliminates or reduces the local noise 118 to quiet the communication environment and to further enhance the ability of the user to hear the incoming signals 120. The canceling signal 122 may be manually or automatically adjusted in both amplitude and phase to further suppress and reduce the effects of the local noise 118 at any location in the communication environment 100. The amplitude is changed via a standard active amplifier, while the phase is adjustable via a standard phase-shift circuit.

The communication unit 110 continuously monitors the local noise 118 and constantly changes the canceling signal 122 to match the local noise 118. The communication unit 110 may cancel stationary local noise signals or dynamic local noise signals that are continuously changing or moving within the communication environment 100. Unwanted broad-band and narrow-band signals and signals having a regular periodic or recurring component can also be eliminated or reduced.

Thus, by having the present invention utilize the talker-to-microphone channel during periods of no talk-spirts to characterize the reverse channel and modify the single input into several mixtures for output to the audio speakers. This modification to the speaker-to-listener channel provides a "cleaner" audio signal (reduced interference plus noise).

Figure 2:
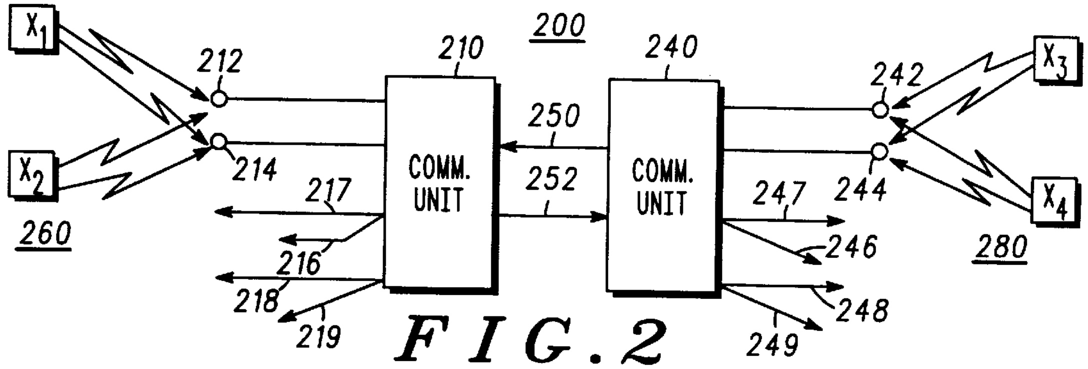
FIG. 2 is a block diagram of a communication system in accordance with the preferred embodiment of the invention.

Referring now to FIG. 2, a block diagram of a communication system 200 is illustrated in accordance with the preferred embodiment of the invention. The communication system 200 preferably includes communication units 210 and 240, channels 250 and 252 and communication environments 260 and 280. It will be recognized that the communication system 200 may include any suitable number of communication units and communication environments.

As shown in FIG. 2, the communication unit 210 includes a first input 212, a second input 214, a first output 216, a second output 217, a third output 218 and a fourth output 219. The first and second inputs 212 and 214 of the communication unit 210 receive signals from an audio input or source $X_1$ that is corrupted by an undesired source $X_2$, such as, for example, a noise field, in the communication environment 260. The first input 212 receives a first mixed signal containing a first signal $a_{11}X_1$ portion (where "a" represents some unknown amplitude) from the audio source $X_1$ and a second signal $a_{12}X_2$ portion from the undesired source $X_2$. The second input 214 of the communication unit 210 receives a second mixed signal containing a first signal $a_{21}X_1$ portion from the audio source $X_1$ and a second signal $a_{22}X_2$ portion from the undesired source $X_2$. It will be recognized that the communication unit 210 may have any suitable number of inputs depending upon the number of audio and undesired sources.

The outputs 216 and 218 of the communication unit 210 transmit an incoming signal $Y_3$ from the communication unit 240 into the communication environment 260. The outputs 217 and 219 of the communication unit 210 also transmit a canceling signal $a'_{12}X_2$ and $a'_{22}X_2$, respectively, into the communication environment 260. The canceling signals have substantially the same frequency and amplitude as the undesired signal emitted from the undesired source $X_2$, but approximately 180 degrees out-of-phase with the undesired signal. The canceling signals are introduced into the communication environment 260 to reduce or cancel the undesired source $X_2$ and to enhance the ability of a user to hear the incoming signal $Y_3$ transmitted over the channel 250 from the communication unit 240.

The communication unit 210 also transmits signals over the channel 252 to the communication unit 240. As shown in FIG. 2, the communication unit 240 of the communication system 200 includes a first input 242, a second input 244, a first output 246, a second output 247, a third output 248 and a fourth output 249. It will be recognized that the communication unit 240 may have any suitable number of inputs depending upon the number of audio and undesired sources.

The first and the second inputs 242 and 244 of the communication unit 240 receives signals from an audio input or source $X_3$ that is corrupted by an undesired source $X_4$ (i.e., a noise field) in the communication environment 280. The first input 242 receives a first mixed signal containing a first signal $a_{31}X_3$ portion from the audio source $X_3$ and a second signal $a_{32}X_4$ portion from the undesired source $X_4$. The second input 244 of the communication unit 240 receives a second mixed signal containing a first signal $a_{41}X_3$ portion from the audio source and a second signal $a_{42}X_4$ portion from the undesired source The outputs 246 and 248 of the communication unit 240 transmit an incoming signal $Y_1$ from the communication unit 210 into the communication environment 280. The outputs 247 and 249 of the communication unit 240 also transmit a canceling signal $a'_{32}X_4$ and $a'_{42}X_4$, respectively, from the communication unit 210 into the communication environment 280. The canceling signals have substantially the same frequency and amplitude as the undesired signal emitted from the undesired source $X_4$, but approximately 180 degrees out-of-phase with the undesired source $X_4$. The canceling signals are introduced into the communication environment 280 to reduce or cancel the undesired signal $X_4$ and to enhance the ability of user to hear the incoming signal $Y_1$ that is transmitted over the channel 252 from the communication unit 210.

Figure 3:
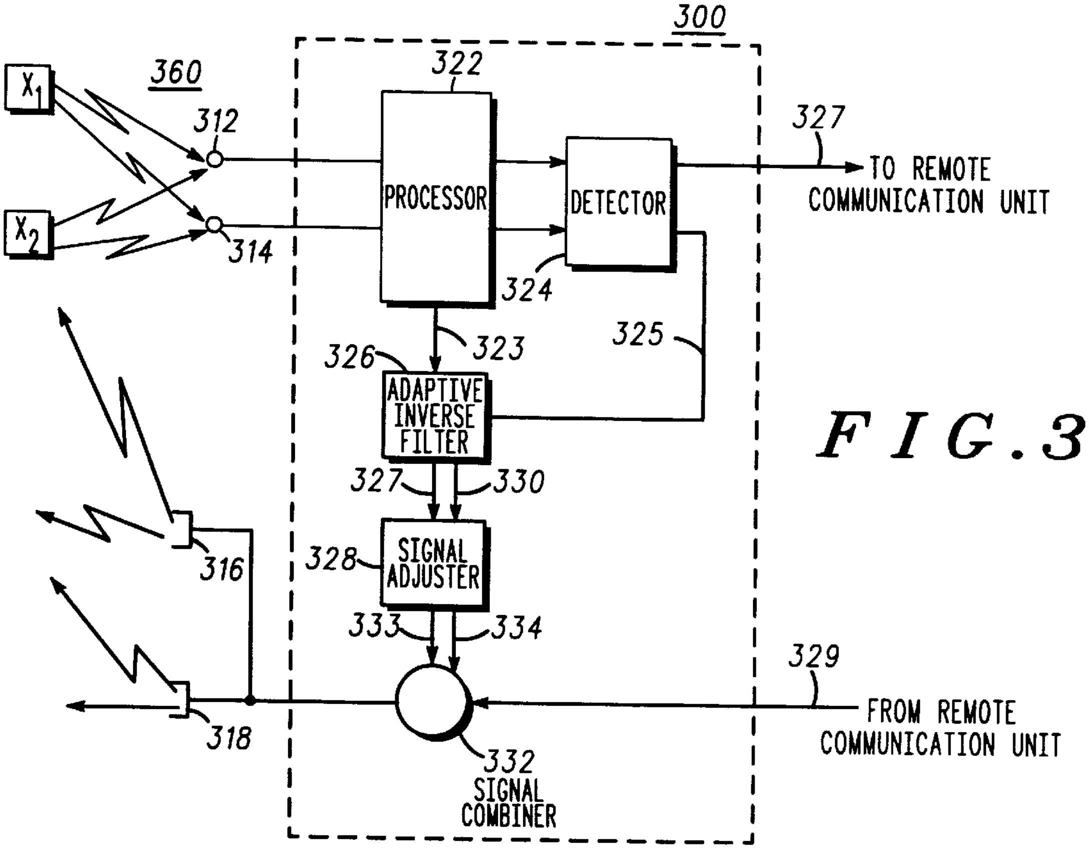
FIG. 3 is a block diagram of the communication unit of FIG. 1 along with the communication system of FIG. 2 in accordance with the preferred embodiment of the invention.

Referring now to FIG. 3, a block diagram of the communication unit of FIG. 1 along with the communication system of FIG. 2 in accordance with the preferred embodiment of the invention is illustrated. The communication unit 300 generally includes at least four transceivers 312, 314, 316 and 318, a processor 322, a detector 324, an adaptive inverse filter 326, a signal adjuster 328, and a signal combiner 332.

The transceiver 312 of the communication unit 300 receives a first mixed signal containing a first signal $a_{11}X_1$ portion from the audio source $X_1$ and a second signal $a_{12}X_2$ portion from an undesired source $X_2$. The transceiver 314 receives a second mixed signal containing a first signal $a_{21}X_1$ portion from the audio source $X_1$ and a second signal $a_{22}X_2$ portion from an undesired source $X_2$. The transceivers 312 and 314 may be any suitable transceiving device, such as, for example, a microphone.

The processor 322 of the communication unit 300 receives the first mixture of the signals $a_{11}X_1+a_{12}X_2$ from the transceiver 312 and the second mixture of the signals $a_{21}X_1+a_{22}X_2$ from the transceiver 314 of the communication unit 300. The processor 322 only has access to the two input mixtures and separates the two mixtures to recover separate signals $Y_1$ and $Y_2$ from the audio source $X_1$ and the undesired source $X_2$.

The processor 322 is capable of separating mixtures having delays and that include a sum of multi-path copies of the signals distorted by the communication environment. The processor 322 includes a blind source separation routine, as further described below, that recovers the signals of "n" sources from different mixtures of the signals received by "n" receivers. Patent application Ser. No. 08/571,329, filed on Dec. 12, 1996, entitled "Methods And Apparatus For Blind Separation Of Delay And Filter Sources", assigned to the assignee of the present invention, which is herein incorporated by reference, discloses techniques for separating multiple sources, including delay and multi-path effects, by blind source separation.

The processor 322 of the communication unit 300 may be a microprocessor, such as, for example, a VeComp parallel digital signal processor (DSP) available from Motorola Inc. The processor 322 may be commanded with a multi-tasking software operating system, such as UNIX or NT Operating System available from Microsoft. The processor 322 may also be programmed with application software and communication software. The software can be written in C language or another conventional high level programming language.

The detector 324 of the communication unit 300 receives the separated signals $Y_1$ and $Y_2$ from the processor 322. The detector 324 determines which signal is the audio signal $Y_1$ and which signal is the undesired signal $Y_2$ Preferably, the detector 324 is a simple energy detection based on threshold comparisons over time intervals suitable for speech detection, such as a rectifier followed by a bandpass filter followed by a time-gated comparator circuit.

The detector 324 transmits the audio signal $Y_1$ to a remote communication unit over a communication link 327. The detector 324 also transmits the undesired signal $Y_2$ to the adaptive inverse filter 326 over a communication link 325.

The adaptive inverse filter 326 receives the undesired signal $Y_2$ from the detector 324 and also receives the noise coefficients which were used to recover the audio signal and the undesired signal from the processor 322 over a communication link 323 as further described below. The noise coefficients calculated at the processor 322 are used by the adaptive inverse filter 326 to calculate filter coefficients representative of the received undesired signal $Y_2$. The adaptive inverse filter 326 includes circuitry to invert the phase of the received undesired signal $Y_2$ to form canceling signals. The adaptive inverse filter 326 may be a mean square error gradient Widrow filter.

The canceling signals are then transmitted to the signal adjuster 328 over a communication links 327 and 330. The signal adjuster 328 changes the canceling signals in both amplitude and phase to effectively eliminate or reduce the undesired signal $Y_2$ in the communication environment 360. It will be recognized that the canceling signals could be varied manually or automatically by, for example, a microprocessor that refers to several standard settings, table-driven, to adjust to several common room types, small, large, echo-rich, etc.

The canceling signals are then routed to a signal combiner 332 over communication links 333 and 334. The signal combiner 332 receives the canceling signals and an incoming audio or voice signal $Y_3$ from a remote communication unit (not shown) over a communication link 329. The signal combiner 332 includes circuitry that combines the canceling signals with the incoming signal $Y_3$ to produce output signals $Y_3+a'_{12}X_2$ and $Y_3+a'_{22}X_2$. The signal combiner is preferably a standard audio mixer with low pass anti-aliasing filter.

The output signals $Y_3+a'_{12}X_2$ and $Y_3+a'_{22}X_2$ are transmitted to the transceivers 316 and 318, respectively. The transceivers 316 and 318 preferably include two or more speakers. The transceivers 316 and 318 introduce the output signals $Y_3+a'_{12}X_2$ and $Y_3+a'_{22}X_2$ into the communication environment 360 to cancel or reduce the undesired signal $X_2$.

The communication unit 300 continuously monitors the noise in the communication environment 360. The canceling signal $C_1$ generated by the communication unit 300 can be manually or automatically adjusted to optimize the canceling effect of the noise reducing signal.

Figure 4:
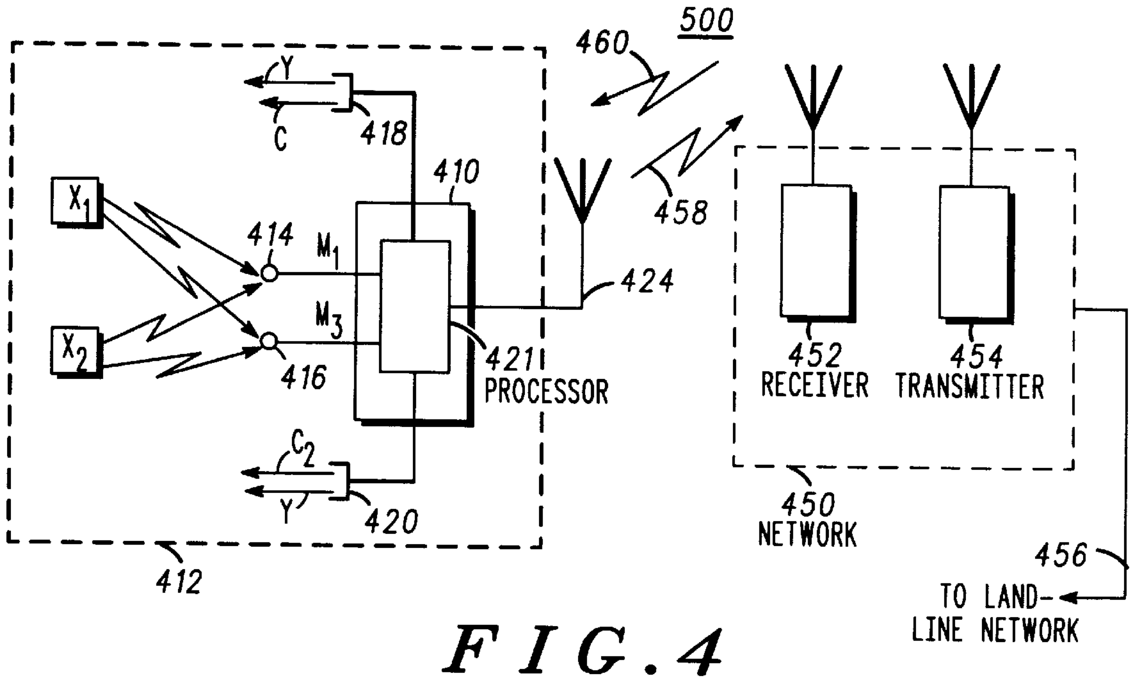
FIG. 4 is a diagrammatic view of a wireless communication system in accordance with the preferred embodiment of the invention.

Referring now to FIG. 4, a diagrammatic view of a wireless communication system and a base station in accordance with the preferred embodiment of the invention is illustrated. The wireless communication system 400 includes one or more subscriber units 410 (one being shown) mounted within a vehicle 412 communicating with a base station 450 over a radio frequency channel. The base station 450 includes at least one receiver 452 to receive signals from the subscriber unit 410, and at least one transmitter 454 to transmit signals to the subscriber unit 410. The base station 450 of the wireless communication system 400 communicates with a land-line network over transmission line 456 or a radio frequency link.

The receiver 452 of the base station 450 provides a communication path 458 from the subscriber unit 410 to the base station 450 over a first frequency, or time slot, or protocol mechanism, such as code division multiple access (CDMA), of a radio frequency channel while the transmitter 454 provides a communication path 460 from the base station 450 to the subscriber unit 410 over a second frequency, or time slot, or protocol mechanism, such as CDMA, of the radio frequency channel.

As shown in FIG. 4, the subscriber unit 410 generally includes two or more microphones 414 and 416, two or more speakers 418 and 420, a processor 421, and an antenna 424 to transmit signals to the base station 450 and to receive signals from the base station 450. The subscriber unit 410 may comprise, for example, a mobile unit, a hardwired unit, a radio unit, a hand held phone, a vehicle mounted unit, or any other suitable voice or data transmitting or receiving device.

The microphones 414 and 416 of the subscriber unit 410 receive signals from an audio source $X_1$ and a noise signal $X_2$. The first microphone 414 receives a first mixed signal containing a first signal $a_{11}X_1$ portion from the audio source $X_1$ (where “a” is an unknown amplitude) and a second signal $a_{12}X_2$ portion from the undesired source $X_2$. The second microphone 416 of the subscriber unit 410 receives a second mixed signal from a first signal $a_{21}X_1$ portion from the audio source $X_1$ and a second signal $a_{22}X_2$ portion from the undesired source $X_2$. It will be recognized that the subscriber unit 410 may have any suitable number of microphones depending upon the number of input signals.

The processor 421 of the subscriber unit 410 receives a first mixture $M_1$ of the signals $a_{11}X_1+al_2X_2$ from the microphone 414 and a second mixture $M_2$ of the signals $a_{21}X_1+a_{22}X_2$ from the microphone 416. The processor 421 separates the two mixtures to recover the signals of the audio source $X_1$ and the undesired source $X_2$ separately. The processor 421 includes a blind source separation routine, as further described below, that recovers the signals of “n” sources from different mixtures of the signals received by “n” receivers. The processor 421 may also include a controller, a detector, an adaptive inverse filter, a signal adjuster and a signal combiner as described above. It will be recognized that the blind source separation routine may be carried out at the base station 450 or other suitable location.

The speakers 418 and 420 of the subscriber unit 410 transmit an incoming signal Y from the base station 450 and transmit a canceling signal $C_1$ and $C_2$, respectively, over communication path 460 into the communication environment of the vehicle 412. The subscriber unit 410 also transmits signals over the communication path 458 to the base station 450.

The canceling signals reduce or cancel the noise source $X_2$ in the communication environment to enhance the ability of a user to hear the incoming signal Y. Thus, the interior of the vehicle may be quieted by reducing or canceling the noise signal to enhance the ability of the user to hear another caller. In addition, vehicle safety is enhanced by allowing the user of the subscriber unit to converse without the necessity of removing one of his/her hands from the steering wheel to hold a handset while talking in a noisy communication environment.

Figure 5:
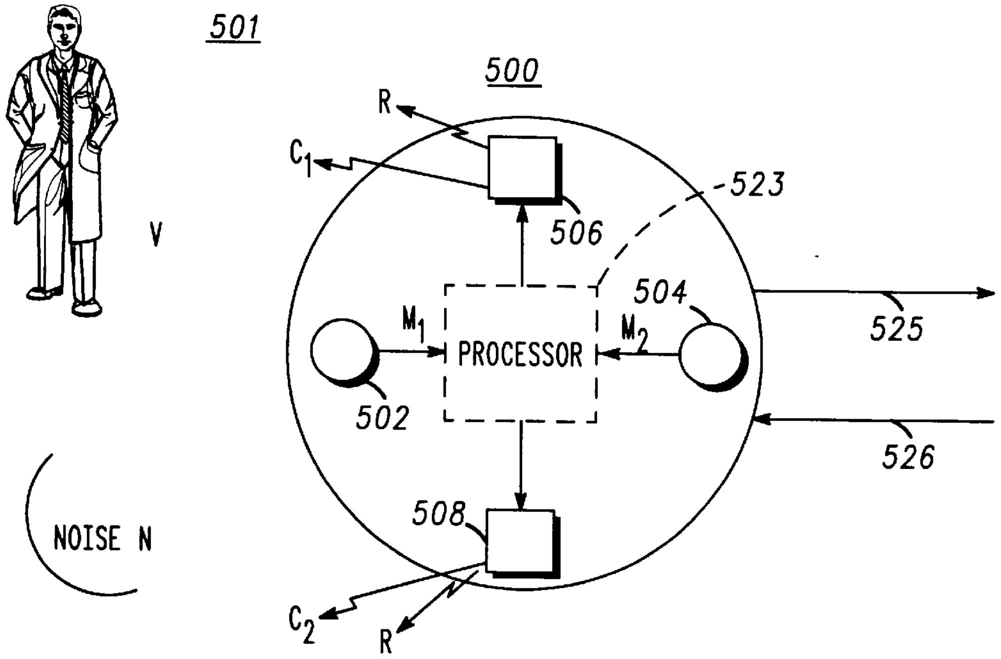
FIG. 5 is a diagrammatic view of a speaker-phone in a communication environment in accordance with the preferred embodiment of the invention.

Referring now to FIG. 5, a diagrammatic view of a speaker-phone in a communication environment in accordance with the preferred embodiment of the invention is illustrated. The speaker-phone 500 generally includes at least two microphones 502 and 504, two or more speakers 506 and 508, a forward channel 525, a reverse channel 526 and a processor 523. It is contemplated that the speaker-phone 500 may be a hardwired or a wireless unit.

The microphones 502 and 504 of the speaker-phone 500 receive signals from an audio or voice source V and a noise source N. The first microphone 502 receives a first mixed signal containing a first signal $a_{11}V$ portion from the voice source V and a second signal $a_{12}N$ portion from the noise source N. The second microphone 504 of the speaker-phone 500 receives a first signal $a_{21}V$ portion from the voice source V and also receives a second signal $a_{22}N$ portion from the noise source N. It will be recognized that the speaker-phone 500 may have any suitable number of inputs depending upon the number of input signals. It is also contemplated that the number of microphones to be utilized may be selected manually or automatically.

Thus, the processor 523 of the speaker-phone 500 receives a first mixture $M_1$ of the signals $a_{11}V+a_{12}N$ from the microphone 502 and a second mixture $M_2$ of the signals $a_{21}V+a_{22}N$ from the microphone 504. The speaker-phone 500 recovers the signals of the voice signal V and the noise signal N separately. The speaker-phone 500 includes a blind source separation routine, as further described below, that recovers the signals of "n" sources from different mixtures of the signals received by "n" receivers separately. The speaker-phone 500 may also include a detector, an adaptive inverse filter, a signal adjuster or a signal combiner as described above. These components may be incorporated into the speaker-phone 500 or may be incorporated at any other suitable location.

The speakers 506 and 508 transmit an incoming signal R from a remote source (not shown) via the reverse channel 526 and a canceling signal $C_1$ and $C_2$ respectively, into the communication environment 501. The canceling signals reduce or cancel the noise source N in the communication environment 501 to enhance the ability of a user to hear the incoming signal R. The speaker-phone 500 also transmits signals over the forward channel 525 to the a remote source.

Figure 6:
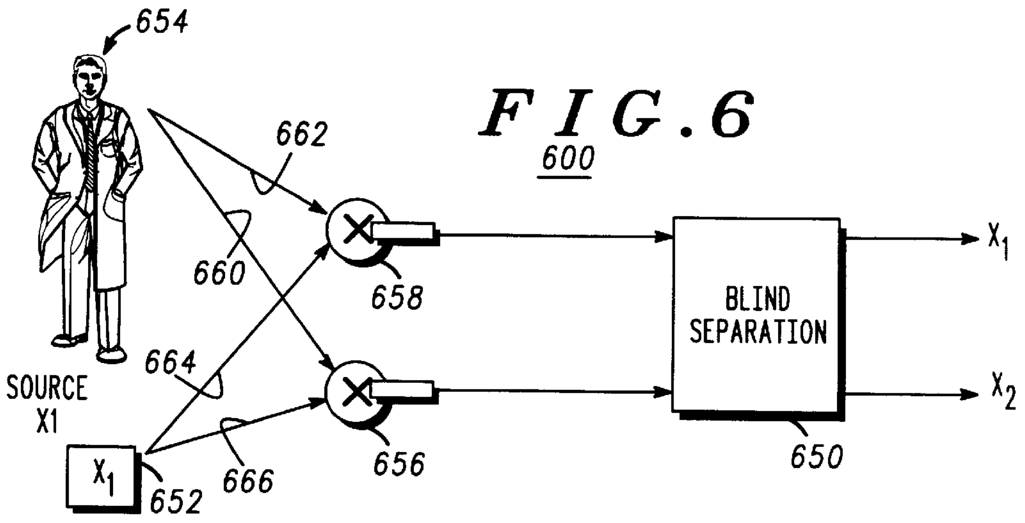
FIG. 6 is a block diagram of a blind source separation process in accordance with the preferred embodiment of the invention.

Referring now to FIG. 6, a block diagram of a blind source separation system, in accordance with the preferred embodiment of the invention, carried out by the processor as described above is illustrated. The blind source separation process 600 separates the mixed signals received by the subscriber unit or a speaker-phone, as described above, into separate signals of the sources.

As shown in FIG. 6, the blind source separation system includes a blind separation unit 650, audio sources 652 and 654, and transceivers 656 and 658. Although only two mixtures of signals of the transceivers 656 and 658 are shown, it will be recognized that the blind source separation system can be utilized for any suitable number of transceivers and their mixtures.

The transceiver 658 receives a signal $a_{11}X_1$ over a communication path 662 from the audio source 654 and also receives a signal $a_{12}X_2$ over communication path 664 from audio source 652. The transceiver 656 receives a signal $a_{21}X_1$ (where "a" represents some unknown amplitude) over a communication path or radio frequency channel 660 from the audio source 654 and also receives a signal $a_{22}X_2$ over communication path 666 from audio source 652.

The blind separation unit 650 receives the signal $a_{11}X_1+al_2X_2$ from the transceiver 658 and receives the signal $a_{21}x_1+a_{22}X_2$ from the transceiver 656 over the radio frequency channels. The blind separation unit 650 only has access to the two input signals and separates then into individual signals $X_1$ and $X_2$ as further described below.

Figure 7:
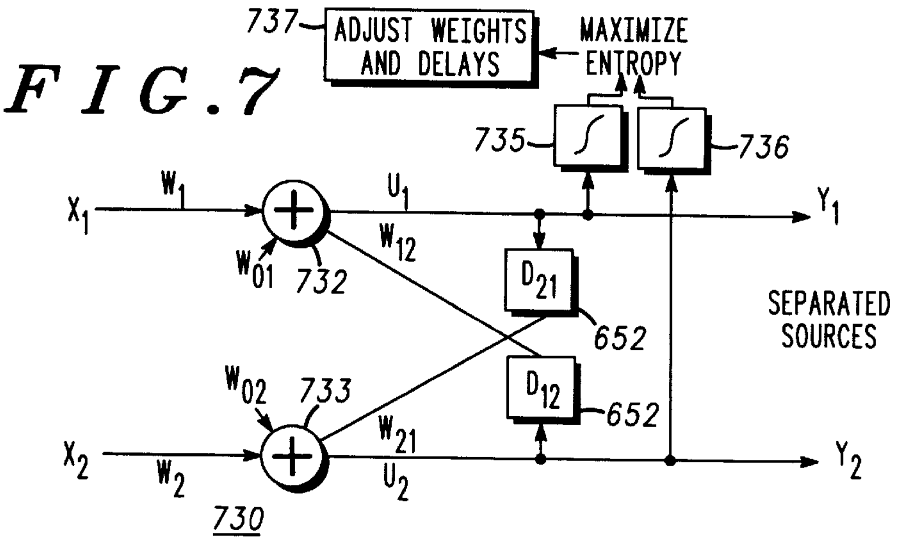
FIG. 7 is a schematic diagram of one embodiment of the blind source separation process of FIG. 6 in accordance with the preferred embodiment of the invention.

Referring now to FIG. 7, a schematic diagram of a blind source separation system 730 is illustrated. As shown in FIG. 7, mixed signals $x_1$ and $x_2$ are applied to a blind source separation process. The blind source separation process separates the signals into separate signals $y_1$ and $Y_2$.

The first mixed signal $x_1$ is multiplied by an adaptive weight $w_1$ to produce a product signal which is applied to a summation circuit 732. Also, the second mixed signal $x_2$ is multiplied by an adaptive weight $w_2$ to produce a product signal which is applied to a summation circuit 733. Bias weights $w_{01}$ and $w_{02}$ are also applied to summation circuits

732 and 733, respectively, although in some special instances these bias weights may be ignored or built into the other components. The output signals of summation circuits 732 and 733 are approximation signals $u_1$ and $u_2$, respectively, which are utilized to generate filtered feedback signals that are then applied to the summation circuits 733 and 732, respectively. In this specific embodiment, a first filtered feedback signal is generated by delaying the approximation signal $u_2$ by a delay $d_{12}$ and multiplying the delayed signal by a weight $w_{12}$. The first filtered feedback signal is applied to the summation circuit 732. Similarly, a second filtered feedback signal is generated by delaying the approximation signal $u_1$ by a delay $d_{21}$ and multiplying the delayed signal by a weight $w_{21}$. The second filtered feedback signal is applied to the summation circuit 733.

Approximation signals $u_1$ and $u_2$ are also applied to output circuits 735 and 736, which pass them through a sigmoid-like function, to produce output signals $y_1$ and $Y_2$. The output signals are utilized in an adjustment circuit 737 to adjust the adaptive weight $w_1$, the first filtered feedback signal, the adaptive weight $w_2$, the second filtered feedback signal and the feedback weights and the delays to maximize entropy of the output signals $y_1$ and $Y_2$ and, thereby, recover the first transmitter signal as the output signal $y_1$ and the second transmitter signal as the output signal $Y_2$.

The blind source separation system 730 thus computes the following, where $u_1$ are the outputs before the nonlinearities, and $w_{oi}$ are the bias weights:

$$u_1(t)=w_1x_1(t)+w_{12}u_2(t-d_{12})+w_{01}$$

$$u_2(t)=w_2x_2(t)+w_{21}u_1(t-d_{21})+w_{02}$$

$$y_1(t)=g(u_1(t))$$

$$y_2(t)=g(u_2(t))$$

where g is, in this example, the logistic function $g(u)=(1/1+e^{-u})$, and g is also referred to as a sigmoid-like function. The mutual information between the outputs $y_1$ and $Y_2$ is minimized by maximizing the entropy at the outputs, which is equal to maximizing E[ln|J|]. The determinant of the Jacobean of the network is now $$|J| = \frac{\partial y_1 \partial y_2}{\partial x_1 \partial x_2} - \frac{\partial y_1 \partial y_2}{\partial x_2 \partial x_1} = y_1 y_2 D \tag{1}$$

$$\ln|J| = \ln(y_1) + \ln(y_2) + \ln(D)$$

$$\text{where } D = \left(\frac{\partial u_1 \partial u_2}{\partial x_1 \partial x_2} - \frac{\partial u_1 \partial u_2}{\partial x_2 \partial x_1}\right) = w_1 w_2,$$

$$y_1 = \frac{\partial y_1}{\partial u_1}, \text{ and } y_2 = \frac{\partial y_2}{\partial u_2}$$

The adaptation rule for each parameter of the network can now be derived by computing the gradient ln |J| with respect to that parameter. For $w_1$, the following is obtained $$\Delta w_1 \propto \frac{\partial \ln|J|}{\partial w_1} = \frac{1 \partial y_1}{y_1 \partial w_1} + \frac{1 \partial y_2}{y_2 \partial w_1} + \frac{1 \partial D}{D \partial w_1}$$

For the logistic function $\alpha y_i/\alpha y_i=1-2y_i$. Thus, for the partial derivatives:

$$\frac{\partial y_1}{w_1} = \frac{\partial y_1 \partial y_1 \partial u_1}{\partial y_1 \partial u_1 \partial w_1} = (1-2y_1)y_1 x_1, \tag{3}$$

-continued $$\frac{\partial y_2}{\partial w_1} = \frac{\partial y_2 \partial y_2 \partial u_2}{\partial y_2 \partial u_2 \partial w_1} = (1-2y_2)y_2 0 = 0,$$

$$\frac{\partial D}{\partial w_1} = \frac{\partial (w_1 w_2)}{\partial w_1} = w_2$$

The adaptation rule for $w_1$ becomes the following from equation (2) above (similarly for $w_2$):

$$\Delta w_1 \; (1-2y_1)x_1+1/w_1,$$

$$\Delta w_2 \; (1-2y_2)x_2+1/w_2 \qquad (4)$$

The bias adaptation is $\Delta w_{oi}\ 1-2_{yi}$. The role of these weights and biases is to scale and to shift the data so as to minimize the mutual information passed through the sigmoid-like function g.

For $w_{12}$, the partial derivatives are as follows:

$$\frac{\partial y_1}{\partial w_{12}} = \frac{\partial y_1 \partial y_1 \partial u_1}{\partial y_1 \partial u_1 \partial w_{12}} = (1-2y_1)y_1 u_2(t-d_{12}), \qquad (5)$$

$$\frac{\partial y_2}{\partial w_{12}} = \frac{\partial y_2 \partial y_2 \partial u_2}{\partial y_2 \partial u_2 \partial w_{12}} = (1-2y_2)y_2 0 = 0$$

$$\frac{\partial D}{\partial w_{12}} = \frac{\partial (w_1 w_2)}{\partial w_{12}} = 0$$

Thus the adaptation for $w_{12}$ is the following (similarly for $w_{21}$)

$$\Delta w_{12} \; (1-2y_1)u_2(t-d_{12}),$$

$$\Delta w_{21} \; (1-2y_2)u_1(t-d_{21}) \qquad (6)$$

These rules decorrelate the present squashed output $y_i$ from the other source u; at delay $d_{ij}$, which is equivalent to separation. Note that in equations (5) and (6) the time indices of $u_1$ and $u_2$ are given in parentheses, whereas for all other variables the time is implicitly assumed to be t. All the partial derivatives starting from equation (1) are also taken at time instance t, which is why it is not necessary to expand the cross partial derivatives recursively backwards into time.

The partial derivatives for the delay $d_{12}$ are:

$$\frac{\partial y_1}{\partial d_{12}} = \frac{\partial y_1 \partial y_1 \partial u_1}{\partial y_1 \partial u_1 \partial d_{12}} = (1-2y_1)y_1 w_{12}(-u_{2(t-d12)}), \qquad (7)$$

$$\frac{\partial y_2}{\partial d_{12}} = \frac{\partial y_2 \partial y_2 \partial u_2}{\partial y_2 \partial u_2 \partial d_{12}} = (1-2y_2)y_2 = 0,$$

$$\frac{\partial D}{\partial w_{12}} = \frac{\partial (w_1 w_2)}{\partial w_{12}} = 0$$

which takes advantage of the fact that $$\frac{\partial u_{2(t-d12)}}{\partial d_{12}} = \frac{d}{dt}(-u_{2(t-d12)}) = -u_2(t-d_{12})$$

The adaptation rules for the delays become the following (again, only the time indices for $u_i$ are explicitly written):

$$\Delta d_{12} \; (1-2y_1)w_{12}u_2(t-d_{12}),$$

$$\Delta d_{21} \; (1-2y_2)w_{21}u_1(t-d_{21}) \qquad (8)$$

It will be recognized that every adaptation rule is local, that is, to adapt a weight or a delay in a branch of the network, only the data coming in or going out of the branch are needed. Generalization to N mixtures can thus be done simply by substituting other indices for 1 and 2 in equations (6) and (8) and summing such terms.

Figure 8:
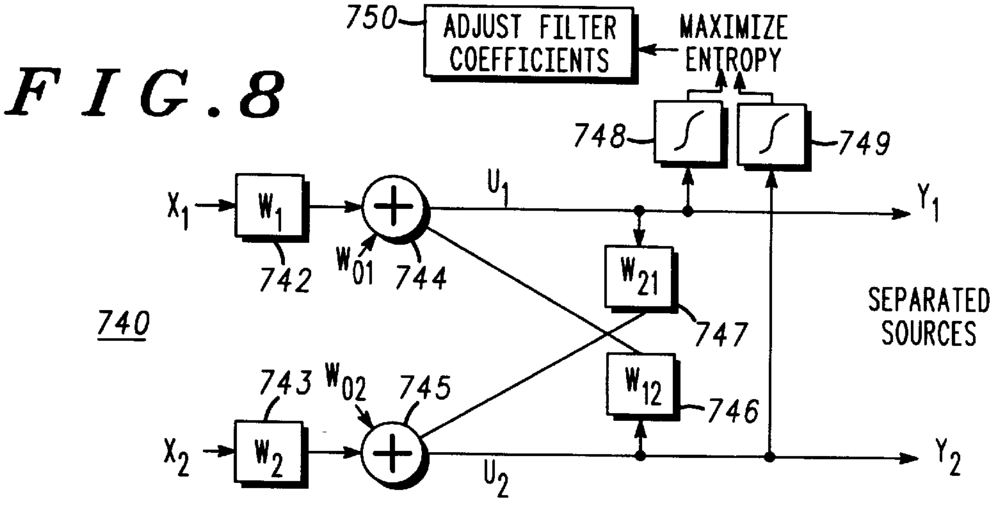
FIG. 8 is a schematic diagram of another embodiment of the blind source separation process of FIG. 6 in accordance with an alternative embodiment of the invention.

As can be seen by referring to FIG. 8, a schematic diagram of another embodiment of the blind source separation system 740 is illustrated. The system 740 receives mixed signals $x_1$ and $x_2$ from two transmitters at inputs of adaptive filters 742 and 743, respectively. Within these filters, the mixed signal $x_1$ is essentially multiplied by a series of different weights associated with a series of different delays and a summation is carried out in adaptive filter 742 to produce a product signal that is applied to a summation circuit 744. Also, the mixed signal $x_2$ is essentially multiplied by a series of different weights associated with a series of different delays and a summation is carried out in adaptive filter 743 to produce a product signal that is applied to a summation circuit 745. Further, as explained previously, bias weights $w_{01}$ and $w_{02}$ are also applied to summation circuits 744 and 745, respectively, although in some special instances these signals may be ignored or built into the other components.

The output signals of the summation circuits 744 and 745 are approximation signals $u_1$ and $u_2$, respectively, which are utilized to generate filtered feedback signals that are then applied to summation circuits 745 and 744, respectively. In this specific embodiment, a first filtered feedback signal is generated by passing the approximation signal $u_2$ through another adaptive filter 746 where $u_2$ is essentially multiplied by a series of different weights associated with a series of different delays and a summation is carried out in adaptive filter 746 to produce a first filtered feedback signal that is applied to the summation circuit 744. Also, a second filtered feedback signal is generated by passing the approximation signal $u_1$ through another adaptive filter 747 where $u_1$ is essentially multiplied by a series of different weights associated with a series of different delays and a summation is carried out in adaptive filter 747 to produce the second filtered feedback signal that is applied to the summation circuit 745. The approximation signals $u_1$ and $u_2$ are also applied to output circuits 748 and 749 which pass $u_1$ and $u_2$ through nonlinearities to produce output signals $y_1$ and $y_2$. The output signals are utilized in an adjustment circuit 750 to adjust the adaptive filters 742, 743, 746 and 747, to maximize entropy of the output signals $y_1$ and $y_2$ and, thereby, recover the first transmitter signal as the output signal $y_1$ and the second transmitter signal as the output signal $y_2$, whose mutual information has been minimized.

While adaptive delays suffice for some applications, for most audio signals they are not enough. The acoustic environment (e.g., surrounding walls) imposes a different impulse response between each transmitter and receiver. Moreover, the receivers may have different characteristics, or at least their frequency response may differ for signals in different directions. To overcome these disadvantages, the blind source separation system 740 of FIG. 8 is utilized, the operation of which is explained by modeling it as the convolved mixtures set forth below. For simplicity, two signals in the z-transform domain are shown, but it will be understood that this can again be generalized to any number of signals.

$$X_1(z)=A_{11}(z)S_1(z)+A_{12}(z)S_2(z),$$

$$X_2(z)=A_{22}(z)S_2(z)+A_{21}(z)S_1(z), \qquad (9)$$

where $A_{ij}$ are the z-transforms of any kind of filters and $S_1$ and $S_2$ are the sources. Solving for the sources S in terms of the mixture signals $X_1$ and $X_2$:

$$S_1(z)=(A_{22}(z)X_1(z)-A_{21}(z)X_2(z/G(z),$$

$$S_2(z)=(A_{11}(z)X_2(z)-A_{12}(z)X_1(z/G(z). \quad (10)$$

By G(z) is denoted as $A_{12}(z)A_{21}(z)-A_{11}(z)A_{22}(z)$. This gives a feed-forward architecture for separation. However, the simple feed-forward architecture by itself does not result in the solution of equation (10). In addition to separation, it has the side-effect of whitening the outputs. The whitening effect is avoided by using blind source separation system 740 of FIG. 8.

In the blind source separation system 740, outputs before nonlinearities (approximation signals) are:

$$U_1(z)=W_{11}(z)X_1(z)+W_{12}(z)U_2(z),$$

$$U_2(z)=W_{22}(z)X_2(z)+W_{21}(z)U_1(z), \quad (11)$$

Using equations (9) and (11) and designating adaptive filter 742 as $W_{11}$, adaptive filter 743 as $W_{22}$, adaptive filter 746 as $W_{12}$, and adaptive filter 747 as $W_{21}$, a solution for perfect separation and deconvolution becomes:

$$W_{11}(z)=A_{11}(z)^{-1},\ W_{12}(z)=A_{12}(z)A_{11}(z)^{-1},$$

$$W_{22}(z)=A_{22}(z)^{-1},\ W_{21}(z)=A_{21}(z)A_{22}(z)^{-1},$$

By forcing $W_{11}=W_{22}=1$, the entropy at the output can be maximized without whitening the sources. In this case $W_{11}$ and $W_{22}$ have the following solutions:

$$W_{11}(z)=1,\ W_{12}(z)=A_{12}(z)A_{22}(z)^{-1},$$

$$W_{22}(z)=1,\ W_{21}(z)=A_{21}(z)A_{11}(z)^{-1}.$$

The adaptation equations for the blind source separation system 740 of FIG. 8 are derived below using, for simplicity, only two sources. In the following equations, $w_{iki}$ denotes the weight associated with delay k from mixture i to approximation signal i, and $w_{ikj}$ denotes the weight associated with delay k from approximation signal j to approximation signal i. Assuming FIR filters for $W_{ij}$ in the time domain the network carries out the following:

For the Jacobean, $$u_1(t)=\sum_{K=0}^{L_{11}} w_{1K1}x_s(t-k)+\sum_{K=1}^{L_{12}} w_{1k2}(t-k)$$

$$u_2(t)=\sum^{L_{11}} w_{1k2}x_2(t-k)+\sum_{K=1}^{L_{21}} w_{2k1}u_1(t-k)$$

For the Jacobean, $$\ln|j|=\ln(y_1)+\ln(y_2)+\ln(D)=\ln(y_1)+\ln(y_2)+\ln(w_{101}w_{202})$$

There will now be three different cases: zero delay weights in direct filters, other weights in direct filters, and weights in feedback cross-filters. Following the steps in previous derivation for all these cases:

$$\Delta w_{ioi} \propto (1-2y_i)x_i+\frac{1}{w_{ioi}},$$

$$\Delta w_{iki} \propto (1-2y_i)x_i(t-k),$$

$$\Delta w_{ikj} \propto (1-2y_i)u_j(t-k).$$

The zero delay weights again scale the data to maximize the information passed through the nonlinearity, other weights in the direct branches of the network decorrelate each output from the corresponding input mixture (whitening), and the weights of the feedback branches decorrelate each output $y_i$ from all of the other sources (approximation signals $u_j$) at every time instant within the scope of the filters t−k (separation).

Accordingly, the apparatus, methods and systems allow an environment to be quieted by injecting signals to cancel or reduce the noise in an environment. The devices receives a different mixture of the signals from an audio signal and an undesired signal. The mixtures received by the receivers are processed preferably utilizing blind source separation techniques to recover the original signal of each of the transmitters.

The device generates a canceling signal that is introduced into a selected spatial region along with an incoming voice transmission signal to eliminate or reduce the undesired signal in a selected spacial region. As a result, a user can hear audio substantially free of noise from the undesired signals. The device is especially useful where the user is in a noisy environment and has difficulty hearing-the caller.

While the invention has been described in conjunction with a specific embodiment thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. Thus, it should be understood that the invention is not limited by the foregoing description, but embraces all such alterations, modifications and variations in accordance with the spirit and scope of the appended claims.

We claim:

1. A method for reducing an undesired signal in a first communication environment comprising:

receiving at least two distinct composite signals from the first communication environment;

separating the at least two distinct composite signals into at least a first and a second signal;

generating at least a third signal based on one of the first and the second signals;

combining the third signal with a fourth signal received from a second communication environment to form a fifth signal and a sixth signal; and introducing the fifth signal and the sixth signal into the first communication environment.

2. The method of claim 1 wherein the third signal is 180 degrees out-of-phase with one of the first and the second signals.

3. The method of claim 2 wherein the third signal at least partially cancels one of the first and the second signals.

4. The method of claim 3 wherein the third signal has a frequency and an amplitude substantially equal to one of the first and the second signal.

5. The method of claim 1 further comprising the step of adjusting a phase of the third signal.

6. A system for reducing an undesired signal in a first communication environment comprising:

at least two receivers, located in the first communication environment, being configured to receive at least two distinct composite signals;

processing circuitry, in communication with the at least two receivers, being configured to separate the at least two distinct composite signals into at least a first signal and a second signal;

adaptive circuitry, in communication with the processor, being configured to generate at least one canceling signal based on one of the first and the second signals;

a signal combiner, in communication with the adaptive circuitry, being configured to combine the at least one canceling signal with a third signal to form a fourth signal and a fifth signal; and at least two transmitters located in the first communication environment, being configured to introduce the fourth signal and the fifth signal into the first communication environment.

7. The system of claim 6 wherein a first communication unit in the first communication environment is in remote communication with a second communication unit in a second communication environment, the first communication unit supporting the at least two receivers, the processor, the circuitry, the signal combiner and the at least two transmitters.

8. The system of claim 6 wherein the adaptive circuitry includes an adaptive inverse filter.

9. The system of claim 8 wherein the adaptive circuitry includes a signal adjuster coupled to the adaptive inverse filter.

10. The system of claim 6 wherein each of the at least two transmitters includes one of a speaker-phone and a subscriber unit.

11. The system of claim 6 wherein each of the at least two receivers comprises a microphone.

12. The system of claim 6 wherein the processing circuitry includes a detector in communication with a processor and a second communication environment.

* * * * *